(12) United States Patent
Arsovski et al.

(10) Patent No.: US 9,601,200 B2
(45) Date of Patent: Mar. 21, 2017

(54) TCAM STRUCTURES WITH REDUCED POWER SUPPLY NOISE

(71) Applicant: INTERNATIONAL BUSINESS MACHINES CORPORATION, Armonk, NY (US)

(72) Inventors: Igor Arsovski, Williston, VT (US); Michael T. Fragano, Essex Junction, VT (US); Thomas M. Maffitt, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/734,504

(22) Filed: Jun. 9, 2015

(65) Prior Publication Data

US 2016/0365146 A1 Dec. 15, 2016

(51) Int. Cl.
*G11C 15/04* (2006.01)
*G11C 15/00* (2006.01)
*G11C 11/413* (2006.01)

(52) U.S. Cl.
CPC .............. *G11C 15/04* (2013.01); *G11C 15/00* (2013.01); *G11C 11/413* (2013.01)

(58) Field of Classification Search
CPC ........ G11C 15/04; G11C 15/00; G11C 11/413
USPC ............................................. 365/49.1, 49.17
See application file for complete search history.

(56) References Cited

U.S. PATENT DOCUMENTS

| | | | |
|---|---|---|---|
| 7,149,101 B1 * | 12/2006 | Om ........................ | G11C 15/00 365/210.1 |
| 7,193,876 B1 | 3/2007 | Park et al. | |
| 7,339,810 B1 * | 3/2008 | Smith .................... | G11C 15/00 365/189.02 |
| 7,447,052 B1 * | 11/2008 | Maheshwari .......... | G11C 15/00 365/49.1 |
| 7,565,482 B1 * | 7/2009 | Rangarajan ............ | G11C 15/00 711/108 |
| 7,613,755 B1 * | 11/2009 | Venkatachary ..... | H04L 63/1416 708/212 |
| 7,823,107 B2 | 10/2010 | Arsovski et al. | |
| 2014/0253226 A1 | 9/2014 | Zhou et al. | |

FOREIGN PATENT DOCUMENTS

JP 4613642 B2 9/2006

OTHER PUBLICATIONS

Kusumoto et al., A Charge Recycling TCAM with Checkerboard Array Arrangement for Low Power Applications, IEEE Asian Solid-State Circuits Conference, Nov. 3-5, 2008, pp. 253-256, Fukuoka, Japan.

* cited by examiner

*Primary Examiner* — Ly D Pham
(74) *Attorney, Agent, or Firm* — Anthony Canale; Andrew M. Calderon; Roberts Mlotkowski Safran Cole & Calderon, P.C.

(57) ABSTRACT

A ternary content addressable memory (TCAM) structure may activate individual groups of subarrays in the TCAM structure, during a non-search mode, at configurable intervals of time. The activating causes the TCAM structure to select locations and sequences in which subarrays of the TCAM structure are activated or deactivated. When activating, the TCAM structure is configured to perform a dummy search within the particular subarray. The activating reduces a change in current during transition between a search mode and the non-search mode.

20 Claims, 10 Drawing Sheets

TCAM STRUCTURES WITH REDUCED POWER SUPPLY NOISE

FIELD OF THE INVENTION

The invention relates to semiconductor structures and, more particularly, to structures and processes for the reduction of power supply noise in ternary content addressable memory (TCAM) structures.

BACKGROUND

Content addressable memory (CAM) is a type of computer memory used in certain high-speed searching applications. In CAM, input search data is compared against a table of stored data, and an address of the matching data is returned.

Binary CAM uses data search words consisting entirely of 1 s and 0 s. Ternary CAM (TCAM), on the other hand, allows a third matching state of "X" for one or more bits in the stored data, thus adding flexibility to the search. For example, a TCAM might have a stored word of "10XX0" which will match any of the four search words "10000", "10010", "10100", or "10110."

Relatively large current and power supply voltage variations are required in a TCAM as the TCAM begins and ends search operations. For example, transitions from a low current demand operation, e.g., a non-search operation, such as a READ operation, WRITE operation, or a no-operation (NOOP) to a high current demand operation, e.g., a search operation, cause relatively large current and power supply voltage variations. These variations can cause functional, timing, and/or other problems within the TCAM and in surrounding components, e.g., other logic/core components on an integrated circuit in which the TCAM is implemented.

To reduce current and power supply voltage variations, Deep Trench (DT) capacitors may be used. However, a DT capacitor is not widely available in environments in which TCAM may be built. Other structures, such as n-well capacitors (NCAPs) or metal-insulator-metal (MIM) capacitors can be used, but provide much less capacitance per unit area.

SUMMARY

In an aspect of the invention, a method may include activating a first group of subarrays of a ternary content addressable memory (TCAM) device during a non-search mode of the TCAM by performing a dummy search within the first group of subarrays; and activating a second group of subarrays of the TCAM device during the non-search mode of the TCAM device by performing the dummy search within the second group of subarrays. The activation of the first and second group of subarrays are provided in a sequential order and reduce a change in current during transition between a search mode and the non-search mode.

In an aspect of the invention, a TCAM structure may activate individual groups of subarrays in the TCAM structure, during a non-search mode, at configurable intervals of time. The activating may cause the TCAM structure to select locations and sequences in which subarrays of the TCAM structure are activated or deactivated. When activating the individual groups of subarrays, the TCAM structure may perform a dummy search. The activating reduces a change in current during transition between a search mode and the non-search mode.

In an aspect of the invention, a method for reducing current load variations in a TCAM structure may include performing a dummy search within a particular subarray of the TCAM structure when the TCAM structure is operating in a non-search mode, where performing the dummy search includes: disabling a latch connected to the particular subarray; searching for a search word in a search area of the particular subarray; and preventing data associated with the search word from being stored by the latch when the search word is found.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

Figure 1:
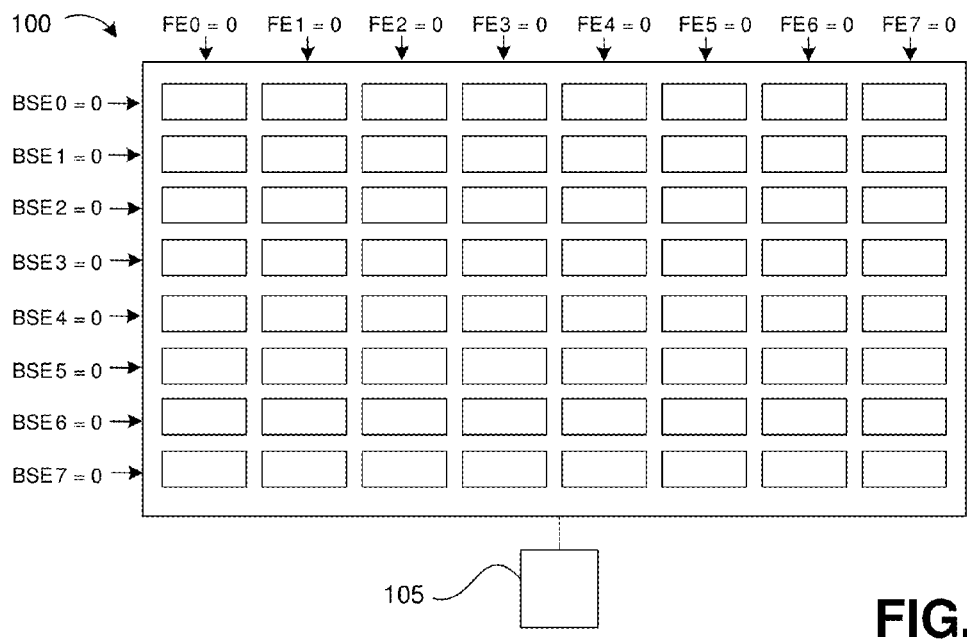
FIGS. 1-5 show a gradual wake-up process for a TCAM in accordance with aspects of the present invention.

The invention relates to semiconductor structures and, more particularly, to structures and processes for the reduction of power supply noise in ternary content addressable memory (TCAM) structures. More specifically, embodiments of the present invention are directed to the reduction of current and voltage variation in semiconductor structures that implement TCAM.

Advantageously, embodiments of the present invention reduce current and power supply voltage variations caused when a TCAM transitions from a non-search operation, such as a READ operation, WRITE operation, or a no-operation (NOOP), to a search operation. In embodiments, the current and power supply voltage variations may be reduced by maintaining a similar current load when the TCAM is operating in non-search modes as the current load when the TCAM is operating in the search mode.

In embodiments, a similar current load may be maintained by implementing a "load maintenance mode" in which "dummy" searches are performed while the TCAM operates in non-search modes. In contrast to an "actual" search, a "dummy" search may be performed for the purposes of loading TCAM subarrays. By performing a dummy search, the TCAM can maintain a relatively consistent load during search operations and non-search operations. The dummy search, though, is not for the purposes of obtaining data or addresses of data as with actual searches.

When performing the "dummy" searches, a search sense amp latch may be blocked or disabled to prevent contamination of previously latched search data, e.g., stored data associated with actual searches with data associated with the dummy searches. As a result, the current and power supply voltage variations caused when transitioning from a search operation to a non-search operation (or vice versa) may be reduced. Also, since the search operation accounts for approximately 90% of total power consumption in TCAMs, maintaining a relatively steady current load when operating in a non-search mode should not significantly impact power consumption.

In embodiments, a TCAM may exit the "load maintenance mode" by discontinuing dummy searches when transitioning from a non-search operation to a search operation. For example, the search sense amp latch may be reactivated when the TCAM transitions from a non-search operation to a search operation, e.g., so that data from the search operation can be stored in the latch. The TCAM may resume the dummy searches when transitioning from a search operation to a non-search operation, and may again disable the search sense amp latch so that data from the dummy searches does not contaminate actual search data.

In embodiments, the amount of "dummy load", e.g., current load as a result of performing the "dummy" searches, may be refined by permitting only a pre-search operation to occur, while preventing a main search operation from occurring. In embodiments, the amount of "dummy load" may also be refined by implementing a pre-compare mask in which some of the "dummy" searches yield a pre-search hit and trigger a main search process. When implementing the pre-compare mask, a search sense amp latch may be blocked or disabled to prevent contamination of previously latched search data, e.g., in the event the main search operations yields a "hit" or result from the "dummy" searches.

In embodiments, current changes may also be reduced during a TCAM "wake-up" process. For example, the current changes may be reduced by gradually loading TCAM subarrays, e.g., by performing "dummy searches" in a controlled manner. Similarly, current changes may be reduced during a TCAM "sleep" or "shut-down" process.

FIGS. 1-5 show a gradual wake-up process for a TCAM in accordance with aspects of the present invention. As shown in FIG. 1, an example TCAM 100 may include subarrays in an 8×8 arrangement. In practice, a TCAM may include a different number of subarrays in a different arrangement, while still implementing the processes described herein. In. FIG. 1, the subarrays in the TCAM 100 are inactive, e.g., a bank search enable (BSE) bit and a field enable (FE) bit are set to zero ("0"). As further shown in FIG. 1, TCAM 100 can be coupled to counter 105.

In embodiments, TCAM 100 may be gradually "woken up" from an inactive state to an active state. The "inactive state" may refer to when TCAM 100 is not performing any operations; whereas, the "active state" may refer to when TCAM 100 is performing an operation, e.g., either a search or non-search operation. In embodiments, a controller or other component coupled to TCAM 100 may activate TCAM 100 when needed.

To gradually "wake up" TCAM 100 from the inactive state to the active state, the subarrays in TCAM 100 may be sequentially activated, e.g., powered up in a certain sequence. That is, the subarrays may be activated in a controlled manner in which groups of subarrays are each activated at periodic time intervals. For example, a group of subarrays may be activated each microsecond, millisecond, second, or at some other period of time. As a result of periodically activating groups of subarrays, the change in current load in TCAM 100 may be reduced in relation to when all of the subarrays are simultaneously activated, e.g., which typically occurs when TCAM 100 is woken up to perform search operations.

Figure 2:
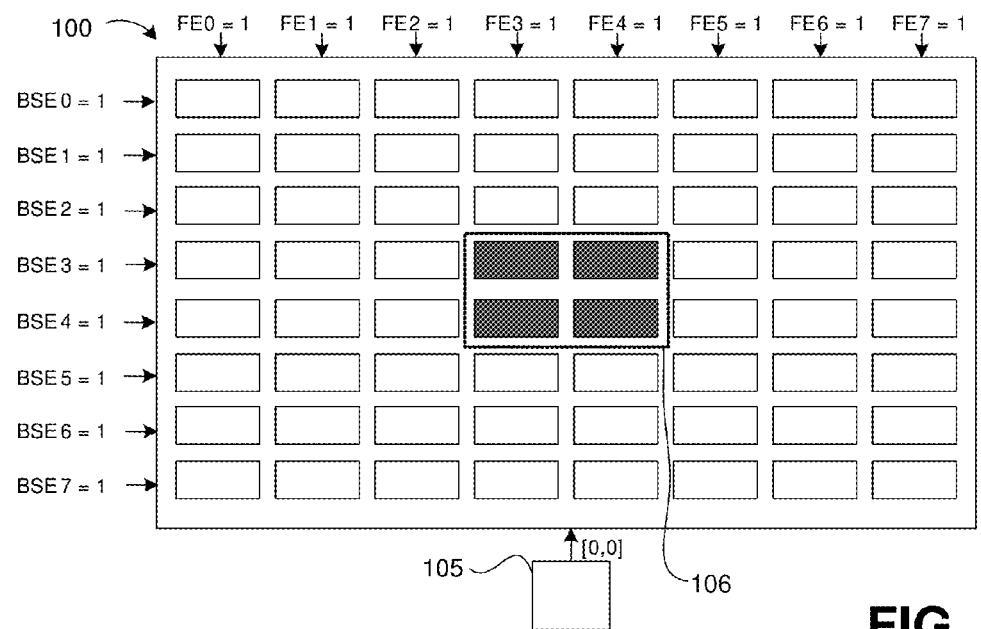

Referring to FIG. 2, TCAM 100 is activated when a chip-enable (CE) bit is set to 1 from 0, e.g., by a controller or other component coupled to TCAM 100. Correspondingly, all of the BSE and FE bits in TCAM 100 transition from 0 to 1 as shown in FIG. 2. Also, when the CE bit transitions from 0 to 1, counter 105 may begin to output a two bit sequence to each of the subarrays in TCAM 100. For example, counter 105 may output a sequence every microsecond, millisecond, second, or at some other interval of time.

Each subarray may include a personalization kernel that identifies whether the subarray should activate based on a particular sequence output by counter 105. For example, as shown in FIGS. 2-5, when a first sequence is outputted by counter 105, a particular group of subarrays may become active. When a second sequence is subsequently outputted by counter 105, an additional group of subarrays may become active, etc., until all of the subarrays in TCAM 100 become active. In this way, TCAM 100 may select the location and sequence of subarrays to activate based on a configurable personalization kernel that identifies which counter sequence activates the subarrays.

In the example of FIG. 2, counter 105 may initially output a first sequence when the CE bit is set to 1 from 0, e.g., by a controller coupled to TCAM 100. For example, counter 105 may output the sequence [0, 0]. Based on receipt of the sequence, particular subarrays may become active by performing dummy searches within these particular subarrays. In the example shown in FIG. 2, the shaded subarrays e.g., subarrays 106 in the center of TCAM 100 may become active. For example, the personalization kernel of the subarrays 106 may determine that the subarrays should be activated when the sequence [0, 0] is received and when the BSE and FE bits are set to 1. The non-shaded subarrays also receive the sequence from counter 105, but may simply ignore this particular sequence. For example, the personalization kernel of the non-shaded subarrays may determine that the subarrays should not respond to the sequence [0, 0]. Once activated, subarrays 106 may initially be in a "load maintenance mode" in which dummy searches are performed and a search sense amp latch is disabled.

Figure 3:
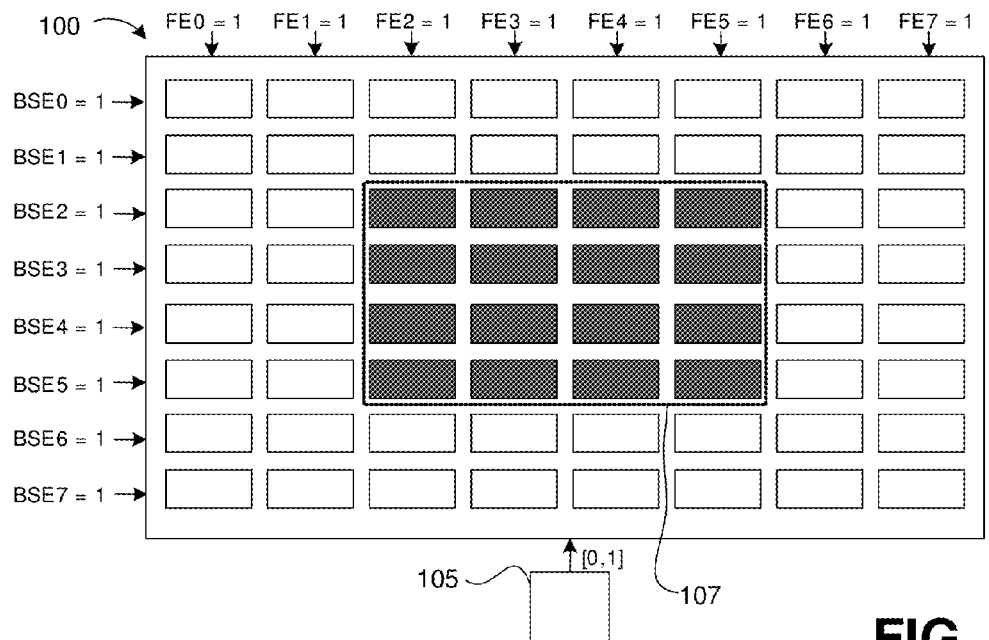

In FIG. 3, counter 105 subsequently outputs a second sequence after a particular amount of time has passed from outputting the first sequence. For example, counter 105 may output the sequence [0, 1]. In response to receiving this sequence, additional subarrays 107 become active, e.g., by performing the dummy searches. As shown in FIG. 3, subarrays 107 surround subarrays 106.

Figure 4:
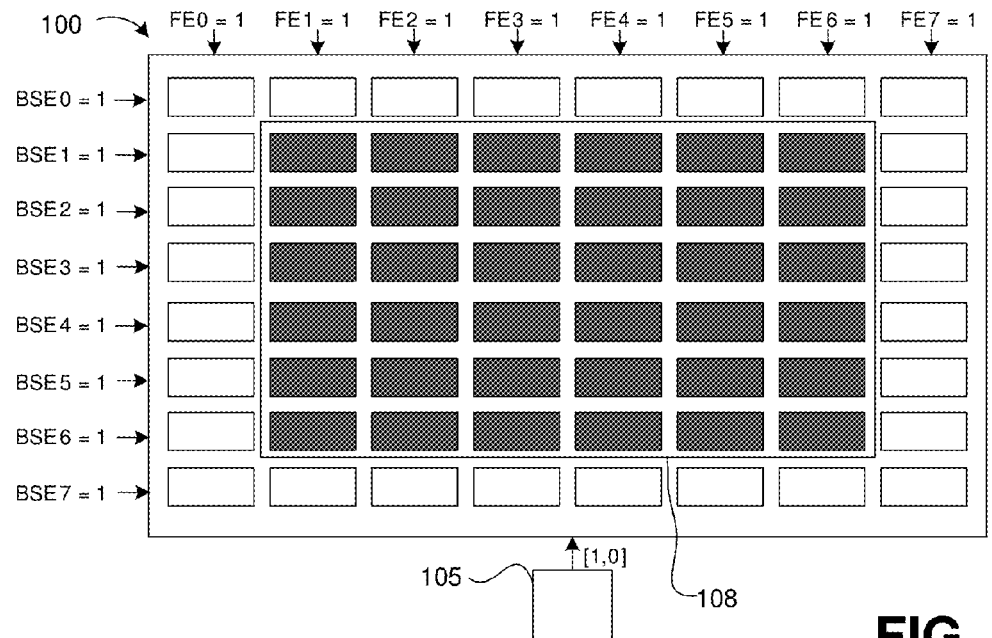
Figure 5:
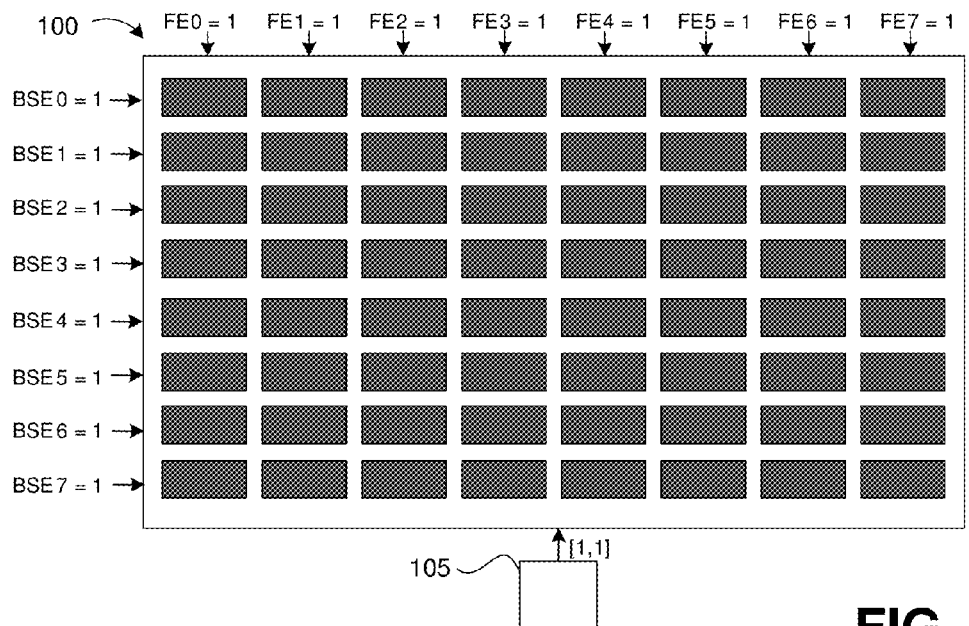

In FIG. 4, counter 105 subsequently outputs a third sequence, e.g., [1, 0] after a particular amount of time has passed from outputting the second sequence. As shown in FIG. 4, subarrays 108 are now active. In FIG. 5, counter 105 subsequently outputs a fourth sequence, e.g., [1, 1] after a particular amount of time has passed from outputting the third sequence, thereby activating the final set of subarrays. Thus, in FIG. 5, all subarrays in TCAM 105 are now active.

As thus shown in FIGS. 1-5, TCAM 100 may be "woken up" from an inactive state, e.g., when the CE bit is 0 to an active state, e.g., when the CE bit is 1 in a gradual manner, thereby reducing the change in current when TCAM 100 transitions from an inactive state to an active state. In the illustrative example of FIGS. 1-5, the center subarrays are initially activated, followed by the surrounding subarrays. In practice, however, the subarrays can be activated in any sequence and in any pattern on TCAM 100, such as a circular pattern, a diagonal pattern, a horizontal pattern, a vertical pattern, etc. Once all of the subarrays of TCAM 100 are active, the dummy searches may be continued when TCAM 100 is performing non-search operations.

Figure 6:
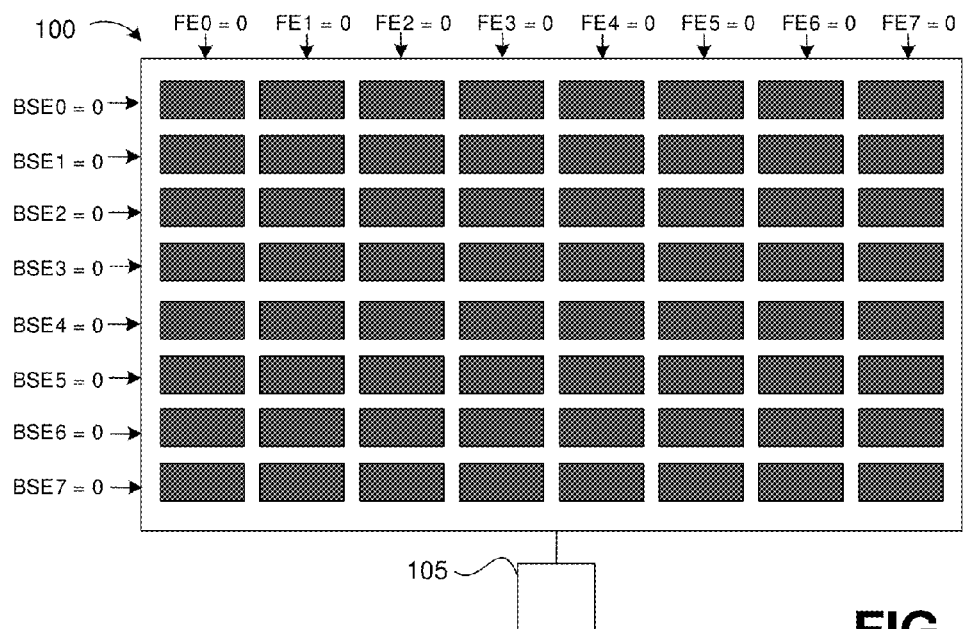
FIGS. 6 and 7 show a gradual shut-down or "sleep" process for a TCAM in accordance with aspects of the present invention.
Figure 7:
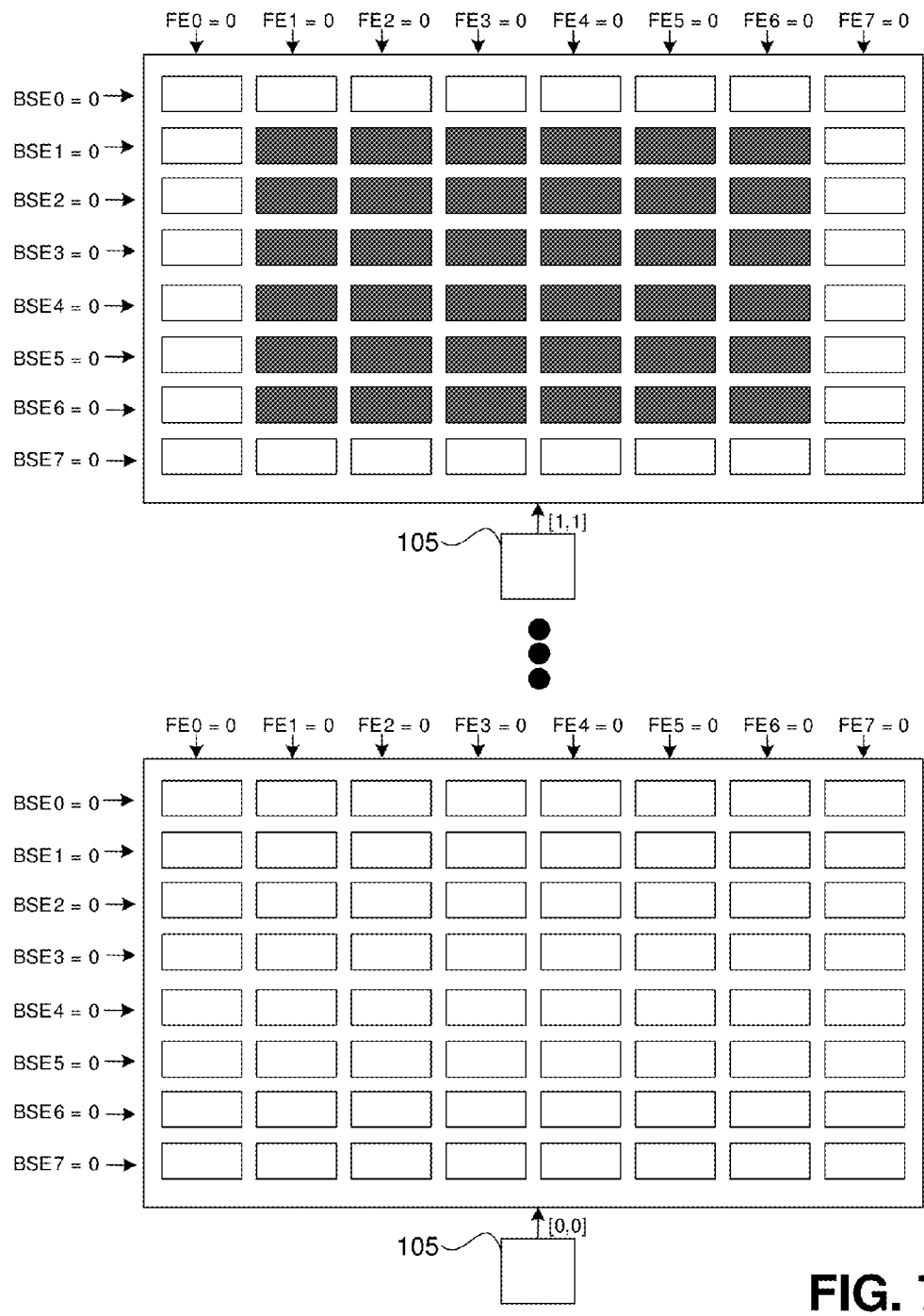

FIGS. 6 and 7 show a gradual shut-down or "sleep" process for a TCAM in accordance with aspects of the present invention. As shown in FIG. 6, the CE bit is set to 0 from 1, e.g., by a controller coupled to TCAM 100, and the FE and BSE bits correspondingly are set to 0 from 1. In FIG. 7, counter 105 may output a first sequence [1, 1] to TCAM 100 when the CE bit is set to 0. Based on receiving this sequence, a first group of subarrays, e.g., the non-shaded subarrays are deactivated. For example, the personalization kernel of the first group of subarrays may determine that subarrays should be deactivated when the sequence [1, 1] is received and when the BSE and FE bits are set to 0. Counter 105 may subsequently output sequences at periodic intervals to cause additional subarrays to deactivate, e.g., in reverse order as the subarrays were activated. That is, TCAM 100 may select the location and sequence of subarrays to deactivate based on a configurable personalization kernel that identifies which counter sequence deactivates the subarrays.

Figure 8:
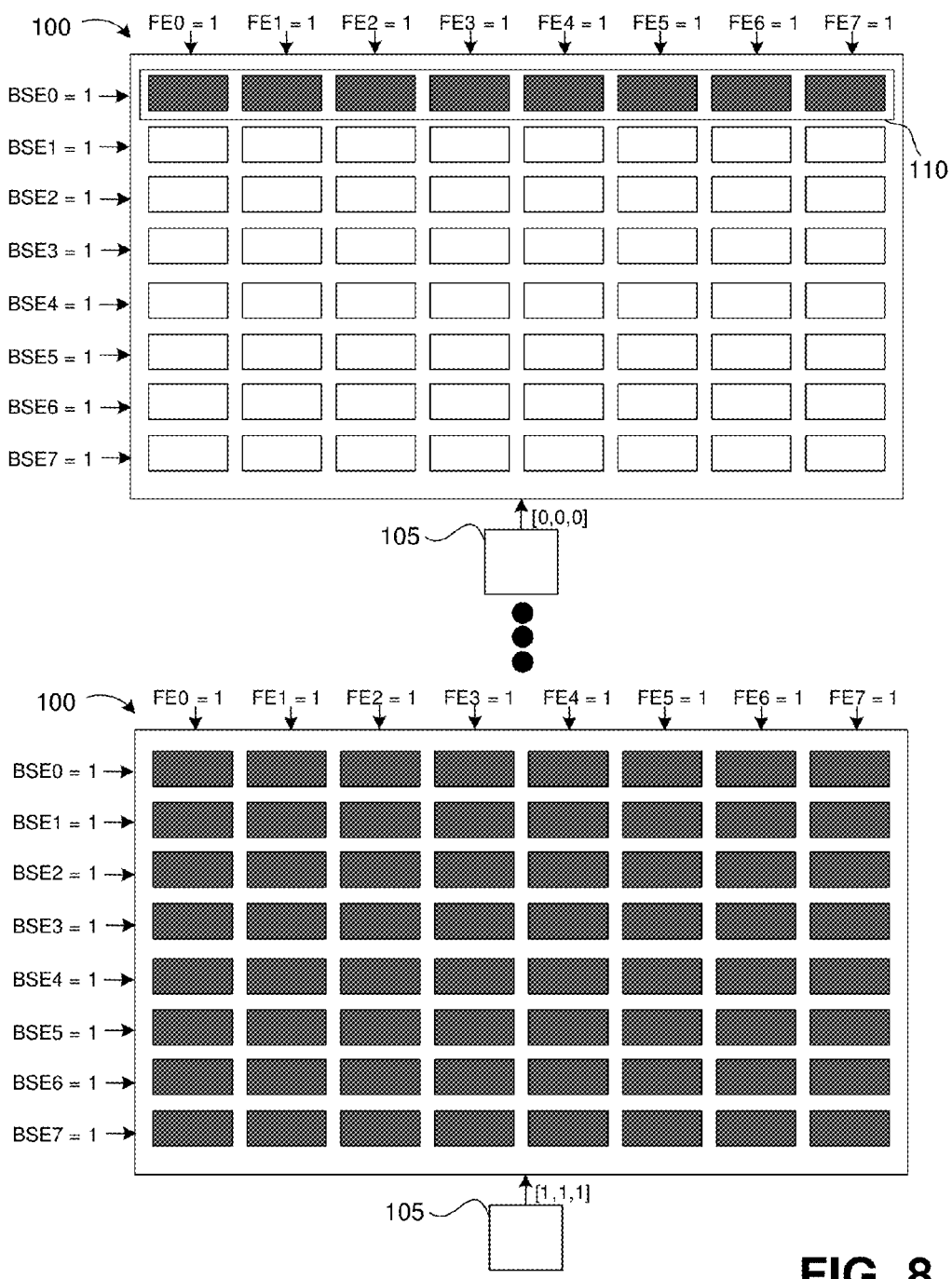
FIG. 8 shows a gradual wake-up process for a TCAM in accordance with additional aspects of the present invention.

In the illustrative example of FIGS. 6 and 7, the outer subarrays are initially deactivated, followed by the inner subarrays. In practice, however, the subarrays can be deactivated in any sequence and in any pattern on TCAM 100, such as a circular pattern, a diagonal pattern, a horizontal pattern, a vertical pattern, etc., to transition from an active state to an inactive state FIG. 8 shows a gradual wake-up process for a TCAM in accordance with an additional aspect of the present invention. As described above, a TCAM, such as TCAM 100 shown in FIGS. 1-7, may be gradually "woken" by activating groups of subarrays at periodic time intervals. In the illustrative example in FIG. 8, the subarrays can be activated row by row. For example, counter 105 may output a total of eight 3-bit sequences over periodic intervals, and each sequence may activate a particular row. As shown in FIG. 8, subarrays 110 may be activated when the sequence [0, 0, 0] is output by counter 105. As counter 105 sequentially outputs sequences at particular intervals, the remaining rows may sequentially be activated until all of the subarrays in the TCAM are activated.

Figure 9:
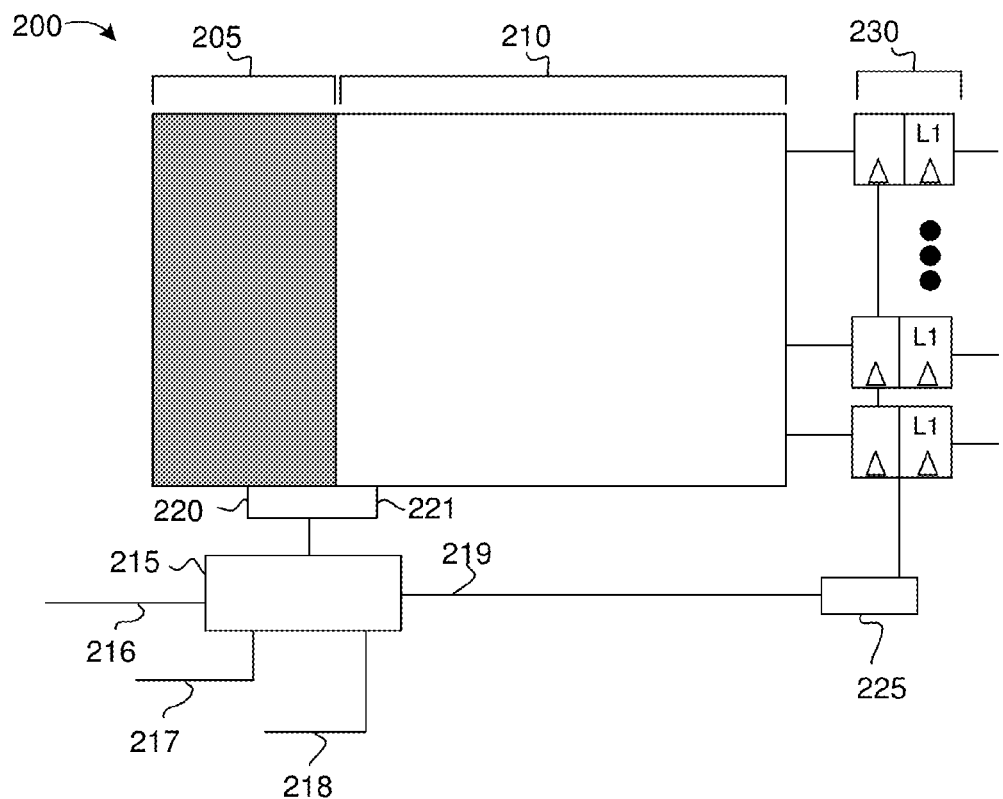
FIG. 9 shows a particular subarray of a TCAM in accordance with aspects of the invention.

FIG. 9 shows a particular subarray of a TCAM in accordance with aspects of the present invention. As shown in FIG. 9, subarray 200 may include a pre-search section 205, main search section 210, load maintenance mode controller 215, clock driver 225, and match evaluation latches 230. Pre-search section 205 may store, for example, 8-bit words. Main search section 210 may store, for example, 120 bit-words. Together, pre-search section 205 and main search section 210 may store 128-bit words, e.g., corresponding to the 128 bits of a search word. As described in greater detail herein, a pre-search is performed where pre-search section 205 is first searched. In the event of a pre-search hit, e.g., when the first 8-bits of a 128-bit search word matches a bit word of pre-search section 205, a main search is performed where main search section 210 is subsequently searched.

Load maintenance mode controller 215 may receive a clock signal, e.g., from a controller coupled to a TCAM, such as TCAM 100 shown in FIGS. 1-7, via clock signal line 216. The clock signal may include a CE bit of 0 or 1, and may be received when the TCAM transitions from an active mode to an inactive mode (or vice versa).

Load maintenance mode controller 215 may receive a search enable or search disable bit via search enable/disable line 217 based on the operation of the TCAM. For example, load maintenance mode controller 215 may receive a search enable bit when the TCAM is operating in a search mode, and a search disable bit when the TCAM is operating in a non-search mode. Load maintenance mode controller 215 may receive a maintenance mode enable or maintenance mode disable bit via maintenance mode enable/disable line 218 based on whether the TCAM is in a maintenance mode in which dummy searches should be performed. If the TCAM is active, e.g., when a CE bit of 1 is received, operating in a non-search mode, and operating in a maintenance mode, load maintenance mode controller 215 may output an evaluation clock signal, e.g., a bit of 0, to clock driver 225 via evaluation clock signal line 219. Based on receiving the evaluation clock signal bit of 0, clock driver 225 may disable match evaluation latches 230. Load maintenance mode controller 215 may further begin performing dummy searches by outputting "dummy search words" to pre-search area 205 of subarray 200 via pre-search line 220. In embodiments, during dummy searches, main search line 221 may be disabled so that only pre-search area 205 is searched. In embodiments, load maintenance mode controller 215 may be connected to pre-search area 205 and main search area 210 via a search line sense amp, as opposed to a direct connection. In embodiments, the TCAM may initially be operating in a non-search mode when the TCAM is initially "woken" from an inactive mode to an active mode.

When the TCAM operates in a search mode and not in a maintenance mode, load maintenance mode controller 215 may discontinue performing the dummy searches and may output evaluation clock signal bit of 1 to clock driver 225. Based on receiving the evaluation clock signal bit of 1, clock driver 225 may enable match evaluation latches 230 so that data associated with an actual search can be stored by match evaluation latches 230. When the TCAM transitions from a search mode to a non-search mode, and from a non-maintenance mode to a maintenance mode, load maintenance mode controller 215 may output a evaluation clock signal bit of 0 to clock driver 225, e.g., to disable match evaluation latches 230—and begin performing dummy searches.

During a search operation, e.g., either a dummy search or an actual search, a pre-search is performed where pre-search section 205 is first searched. In the event of a pre-search hit, e.g., when the first 8-bits of a 128-bit search word matches a bit word of pre-search section 205, a main search is performed where main search section 210 is subsequently searched. For example, in the event of a pre-search hit, main search match lines are activated. Data from an actual search may be stored and output via match evaluation latches 230. As described above, match evaluation latches 230 may be disabled during dummy searches to prevent contamination of data stored by match evaluation latches 230.

In embodiments, during dummy searches both the pre-search and the main search may be permitted, e.g., main search match lines may be activated in the event of a pre-search hit. In alternative embodiments, during dummy searches only the pre-search may be permitted, e.g., main search match lines would not be activated in the event of a pre-search hit. For example, in the event of a pre-search hit, subarray 200 may ignore the pre-search hit so that the main search match lines are not activated. In embodiments, the dummy search words may include a trigger sequence that identifies that the search word is a dummy search word, and that any pre-search hits should be ignored. Since a majority of actual searches rarely result in a pre-search hit, permitting only the pre-search during a dummy search may load subarray 200 with a similar amount of current load as an actual search, while also reducing power consumption by preventing the main search match lines from activating. In alternative embodiments, a pre-compare mask can adjust the percentage of main search match lines that are activated by dummy searches, e.g., to further tune the amount of current load of subarray 200.

Figure 10:
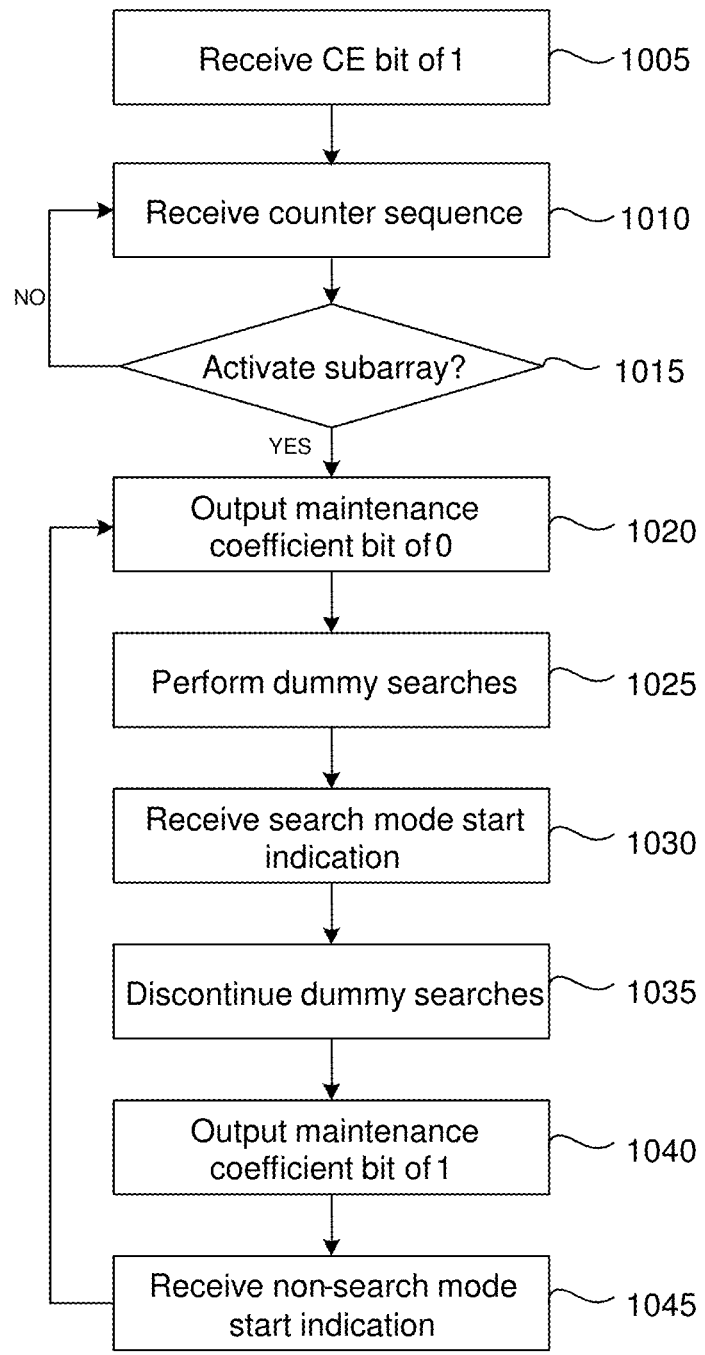
FIG. 10 shows a flow diagram for activating a subarray, entering a load maintenance mode, and ending the low maintenance mode, in accordance with aspects of the invention.
Figure 11:
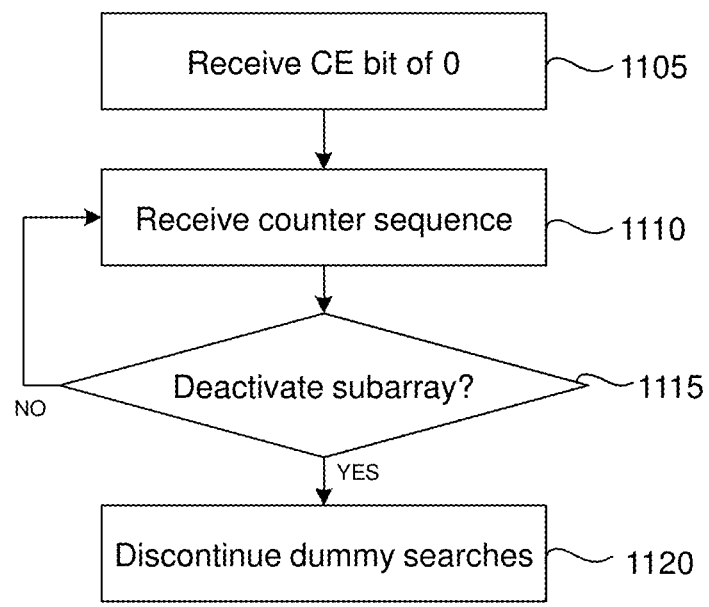
FIG. 11 shows a flow diagram for deactivating a subarray in accordance with aspects of the invention.

FIGS. 10 and 11 show flow diagrams of processes in accordance with aspects of the present invention. The flow diagrams in FIGS. 10 and 11 illustrate the architecture, functionality, and operation of possible implementations of systems, methods, and computer program products according to various embodiments of the present invention. In this regard, each block in the flowchart may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the flowchart illustration, and combinations of blocks in the flowchart illustration, can be implemented by special purpose hardware-based systems that perform the specified functions or acts or carry out combinations of special purpose hardware and computer instructions. The process described herein can be implemented as a computer program product which may include a computer readable storage medium (or media) having computer readable program instructions thereon for causing a processor to carry out aspects of the invention. The computer readable storage medium is any physical storage medium or device and should not be interpreted as a non-transient signal, per se.

FIG. 10 shows a process for activating a subarray, entering a load maintenance mode, and ending the low maintenance mode. At step 1005, a CE bit of 1 is received, e.g., when a TCAM, such as TCAM 100 of FIGS. 1-7, transitions from an inactive mode to an active mode. At step 1010, a counter sequence is received, e.g., from counter 105. At step 1015, a determination is made to activate a subarray based on receiving the CE bit of 1 and based on the counter sequence. For example, the determination may be based on a personalization kernel that defines whether the subarray should be activated for a particular counter sequence. If, for example, the subarray should not be activated (step 1015—NO), another counter sequence may be received. For example, as described herein, counter 105 may continue to output counter sequences at periodic intervals. If, on the other hand, the subarray should be activated (step 1015—YES), an evaluation clock signal bit of 0 may be outputted, e.g., to match evaluation latches 230, thereby entering the subarray into a load maintenance mode (at step 1020). At step 1025, perform dummy searches may be performed, e.g., by outputting dummy search words.

At step 1030, a search mode start indication is received, e.g., when the TCAM begins a search operation. At step 1035, the dummy searches are discontinued. At step 1040, an evaluation clock signal bit of 1 is outputted, e.g., to match evaluation latches 230, thereby enabling the latches so that data from actual searches can be stored. At step 1045, a non-search mode start indication is received, e.g., when the TCAM ends search operations, such as when the TCAM begins read or write operations. When the non-search mode start indication is received, the load maintenance mode may be restarted by outputting the evaluation clock signal bit of 0, at step 1020. In embodiments, a configurable percentage of subarrays 200 may always operate in the load maintenance mode, whether or not the TCAM is in a search mode or non-search mode.

FIG. 11 shows a process for deactivating a subarray. At step 1105, a CE bit of 0 is received, e.g., when a TCAM, such as TCAM 100 or FIGS. 1-7, transitions from an active mode to an inactive mode. At step 1110, a counter sequence is received, e.g., from a counter. At step 1115, a determination is made whether to deactivate the subarray based on receiving the CE bit of 0 and based on the counter sequence. For example, the determination may be based on a personalization kernel that defines whether the subarray should be deactivated for a particular counter sequence.

If, for example, the subarray should not be deactivated (step 1115—NO), another counter sequence may be received. For example, as described herein, counter 105 may continue to output counter sequences at periodic intervals. If, on the other hand, the subarray should be deactivated (step 1115—YES), dummy searches should be discontinued (at step 1120), thereby "deactivating" the subarray. As described herein, subarrays in the TCAM are deactivated in a controlled manner to reduce the change in current when the TCAM transitions from an active mode to an inactive mode.

Figure 12:
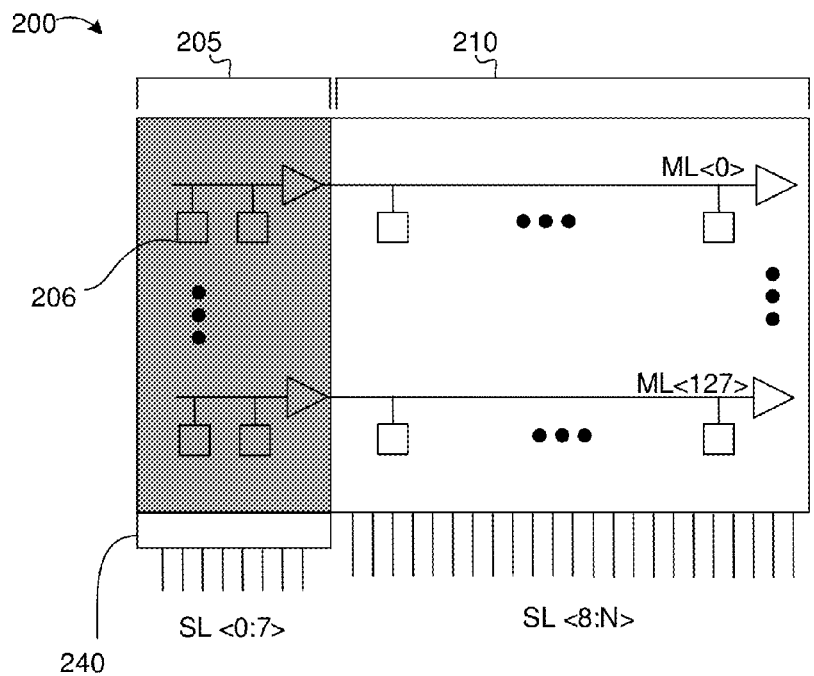
FIG. 12 shows a particular subarray of a TCAM with a pre-compare mask in accordance with aspects of the present invention.

FIG. 12 shows a particular subarray of a TCAM with a noise management pre-compare mask (NMPM) in accordance with aspects of the present invention. As shown in FIG. 12, an NMPM may be provided at a pre-search section having bit words. The NMPM may receive bits of a search word via search lines. In the illustrative example of FIG. 12, the NMPM may receive 8 bits of a dummy search word via search lines (SL<0:7>). "X" variables, or "don't care" variables can be programmed into the NMPM such that more "X" variables yields a higher percentage of a pre-search hit in which main match lines ML<0> to ML<127> become activated. For example, the presence of more "X" variables increases the chances of the NMPM permitting bits from passing to the pre-search section, and thus increasing the chance of a pre-search hit. As such, the current load in the subarray can be fine tuned by adjusting the percentage of main match line activations by adjusting the quantity of "X" variables. The larger percentage of main MLs may result in lower current load variations, but may also consume additional power.

Figure 13:
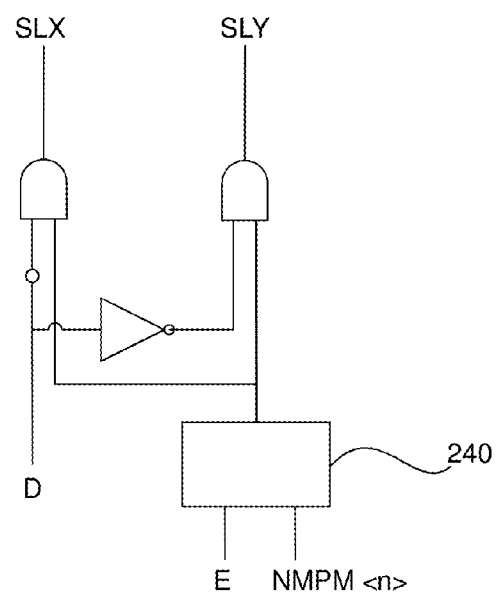
FIG. 13 shows an example circuit for tuning current load in a particular TCAM subarray.

FIG. 13 shows a pre-compare circuit implemented by a subarray in a TCAM. As shown in FIG. 13, NMPM 240 may implement N number of "X" variables. The greater number of "X" variables increases the chances of an enable input "E" being high. When the enable input is high, a data input "D" can be output via search line "X" (SLX) to pre-search section 205, and the opposite of data input D can be output via search line "Y" (SLY) to pre-search section 205.

Figure 14:
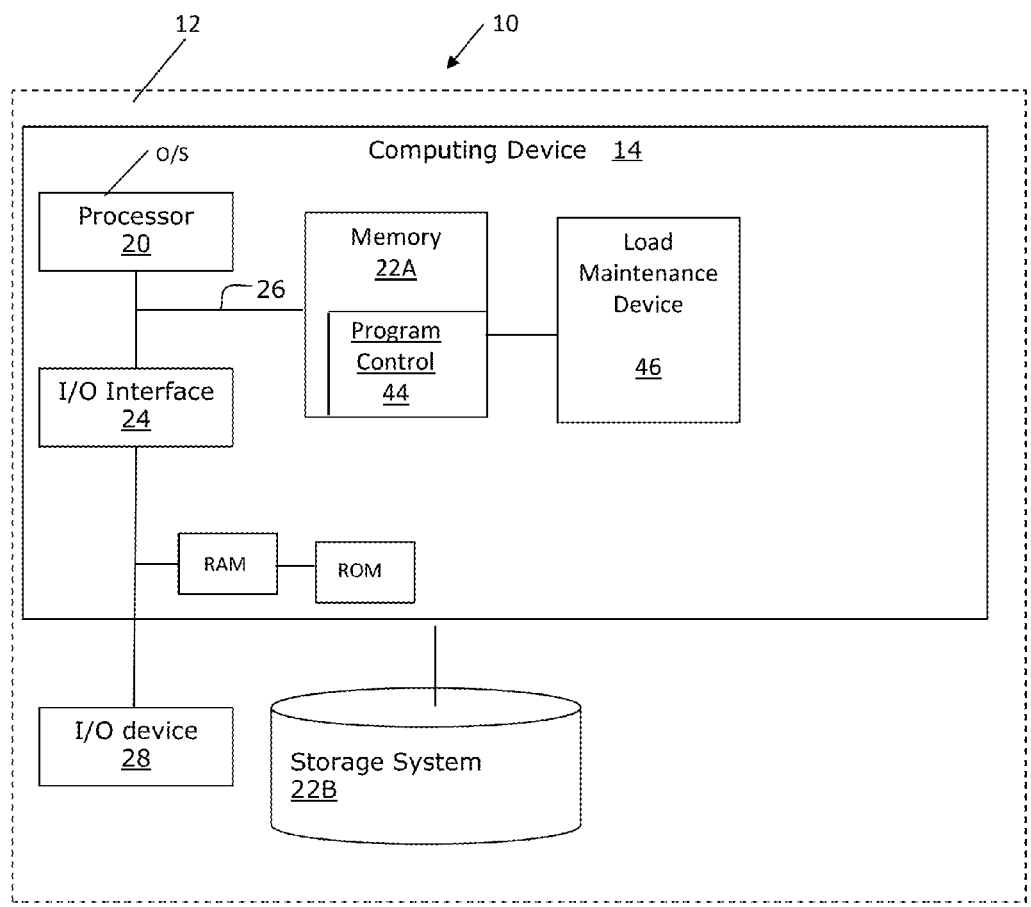
FIG. 14 shows an illustrative environment for implementing the steps in accordance with aspects of the invention.

FIG. 14 shows an illustrative environment 10 for managing the processes in accordance with the invention. To this extent, environment 10 includes a server 12 or other computing system that can perform the processes described herein. In particular, server 12 includes a computing device 14. The computing device 14 can be resident on a network infrastructure or computing device of a third party service provider (any of which is generally represented in FIG. 14).

The computing device 14 includes a processor 20, e.g., CPU, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14, e.g., user interface) or any device that enables computing device 14 to communicate with one or more other computing devices using any type of communications link. The external I/O device/resource 28 may be for example, a handheld device, PDA, handset, keyboard etc.

In general, processor 20 executes computer program code, e.g., program control 44), which can be stored in memory 22A and/or storage system 22B. Moreover, in accordance with aspects of the invention, program control 44 controls a load maintenance device 46, e.g., the processes described herein. For example, load maintenance device 46 can implement the process flows of FIGS. 10 and 11 and the sequence of events shown in FIGS. 1-8. The load maintenance device 46 can be implemented as one or more program code in program control 44 stored in memory 22A as separate or combined modules. Additionally, the load management device 46 may be implemented as separate dedicated processors or a single or several processors to provide the function of these tools. While executing the computer program code, the processor 20 can read and/or write data to/from memory 22A, storage system 22B, and/or I/O interface 24. Storage system 22B can include a information associated with the personalization kernel, as described herein. The program code executes the processes of the invention, which can be provided as a computer program product stored on the computer readable storage medium. The bus 26 provides a communications link between each of the components in computing device 14.

The computing device 14 can comprise any general purpose computing article of manufacture capable of executing computer program code installed thereon, e.g., a personal computer, server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, server 12 is only illustrative of various types of computer infrastructures for implementing the invention. For example, in embodiments, server 12 comprises two or more computing devices, e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks, e.g., the Internet, a wide area network, a local area network, a virtual private network, etc.); and/or utilize any combination of transmission techniques and protocols.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
activating a first group of subarrays of a ternary content addressable memory (TCAM) device during a non-search mode of the TCAM by performing a dummy search within the first group of subarrays;
activating a second group of subarrays of the TCAM device during the non-search mode of the TCAM device by performing the dummy search within the second group of subarrays,
wherein the activation of the first and second group of subarrays are provided in a sequential order and reduce a change in current during transition between a search mode and the non-search mode; and
subsequently activating additional groups of subarrays until all the subarrays in the TCAM device are activated.

2. The method of claim 1, further comprising transitioning into the search mode by discontinuing the dummy search.

3. The method of claim 2, wherein an average current load during the search mode is substantially similar to an average current load during the non-search mode.

4. The method of claim 3, further comprising resuming the dummy search when transitioning to the non-search mode.

5. The method of claim 1, wherein the dummy search comprises disabling a latch such that search results obtained from the dummy search are not stored in the latch.

6. The method of claim 1, further comprising:
deactivating the second group of subarrays by discontinuing the dummy searches within the second group of subarrays; and
deactivating the first group of subarrays by discontinuing the dummy searches within the first group of subarrays, wherein the deactivation of the second and first group of subarrays are provided in a sequential order and reduce a change in current during transition between an active mode and an inactive mode.

7. The method of claim 1, wherein performing the dummy search comprises:
   searching for first portions of search words in a pre-search area; and
   permitting a configurable percentage of second portions of the search words to be searched in a main search area using a pre-compare mask.

8. The method of claim 1, wherein the first group of subarrays includes subarrays in a center of the TCAM device and the second group of subarrays includes subarrays surrounding the first group of subarrays.

9. The method of claim 1, wherein the first group of subarrays includes subarrays in a row or column of the TCAM device, and the second group of subarrays includes subarrays in another row or column of the TCAM device.

10. The method of claim 1, further comprising:
    transitioning into the search mode by discontinuing the dummy search; and
    resuming the dummy search when transitioning to the non-search mode.

11. The method of claim 1, wherein the activating the first group of subarrays is based on receiving a first maintenance coefficient indicating a start of the non-search mode.

12. The method of claim 11, wherein the discontinuing the dummy searches is based on receiving a second maintenance coefficient indicating a start of the search mode.

13. A method comprising:
    activating a first group of subarrays of a ternary content addressable memory (TCAM) device during a non-search mode of the TCAM by performing a dummy search within the first group of subarrays;
    activating a second group of subarrays of the TCAM device during the non-search mode of the TCAM device by performing the dummy search within the second group of subarrays,
       wherein the activation of the first and second group of subarrays are provided in a sequential order and reduce a change in current during transition between a search mode and the non-search mode; and
    transitioning into the search mode by discontinuing the dummy search.

14. A ternary content addressable memory (TCAM) structure configured to:
    activate individual groups of subarrays in the TCAM structure, during a non-search mode, at configurable intervals of time, the activating causing the TCAM structure to select locations and sequences in which subarrays of the TCAM structure are activated or deactivated,
       wherein when activating the individual groups of subarrays, the TCAM structure is configured to perform a dummy search, and
       wherein the activating reduces a change in current during transition between a search mode and the non-search mode.

15. The TCAM structure of claim 14, wherein when performing the dummy search, the TCAM structure is configured to:
    disable a latch; and
    search for a search word in a search area,
    wherein when the search word is found, data associated with the search word is prevented from being stored by the latch.

16. The TCAM structure of claim 15, wherein when disabling the latch, the TCAM structure is configured to output a binary bit to the latch.

17. The TCAM structure of claim 14, wherein when performing the dummy search, the TCAM structure is configured to:
    search for a first portion of a search word in a pre-search area; and
    prevent a second portion of the search word to be searched in a main search area when the first portion of the search word is found in the pre-search area.

18. The TCAM structure of claim 14, wherein when performing the dummy search, the TCAM structure is configured to:
    search for first portions of search words in a pre-search area;
    permit a configurable percentage of second portions of the search words to be searched in a main search area using a pre-compare mask provided at the pre-search area.

19. The TCAM structure of claim 14, wherein center subarrays are first activated, followed by subarrays surrounding the center subarrays.

20. The TCAM structure of claim 14, wherein an average current load when the dummy search is being performed is substantially similar to an average current load when an actual search is being performed.

* * * * *